(12) United States Patent
Wilcox

(10) Patent No.: US 6,687,172 B2
(45) Date of Patent: Feb. 3, 2004

(54) INDIVIDUAL MEMORY PAGE ACTIVITY TIMING METHOD AND SYSTEM

(75) Inventor: Jeffrey R. Wilcox, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 10/116,847

(22) Filed: Apr. 5, 2002

(65) Prior Publication Data

US 2003/0189870 A1 Oct. 9, 2003

(51) Int. Cl.$^7$ ................................................. G11C 7/00
(52) U.S. Cl. ............. 365/201; 365/189.05; 365/189.12; 365/194
(58) Field of Search ............................ 365/201, 189.12, 365/189.05, 194

(56) References Cited

U.S. PATENT DOCUMENTS

| | | | |
|---|---|---|---|
| 5,386,383 A | * | 1/1995 | Raghavachari ......... 365/189.05 |
| 5,473,572 A | | 12/1995 | Margeson, III |
| 5,848,022 A | | 12/1998 | Jiang |
| 6,111,812 A | | 8/2000 | Gans et al. |
| 6,233,661 B1 | | 5/2001 | Jones et al. |
| 6,269,433 B1 | | 7/2001 | Jones et al. |
| 6,304,502 B1 | * | 10/2001 | Watanabe et al. ........... 365/201 |
| 6,389,520 B2 | * | 5/2002 | Christenson ................ 711/157 |
| 6,564,284 B2 | * | 5/2003 | Christenson .................... 711/5 |

OTHER PUBLICATIONS

Double Data Rate (DDR) SDRAM, Rev. 2/00, pp. 1–67, Microcon Semiconductor Products, Inc., Boise ID, USA.

Cuppu, V., et al., "A Performance Comparison of Contemporary DRAM Architectures", IEEE, Proceedings of the 26$^{th}$ International Symposium on Computer Architecture, May 2–4, 1999, pp. 1–12.

Yamauchi, T., et al., "The Hierarchical Multi–Bank DRAM: A High–Performance Architecture for Memory Integrated with Processors", Proceedings of the 17$^{th}$ Conference on Advanced Research in VLSI (ARVLSI '97), 17 pages.

Cuppu, et al., "High–Performance DRAMs in Workstation Environments", IEEE Transactions on Computers, vol. 50, No. 11, Nov. 2001, pp. 1–20.

\* cited by examiner

Primary Examiner—Michael S. Lebentritt
Assistant Examiner—Pho M. Luu
(74) Attorney, Agent, or Firm—Blakely, Sokoloff, Taylor & Zafman LLP

(57) ABSTRACT

A per bank closure system for use in a multi-bank memory includes a timer, an activity and a closure and closure register. The timer is used to define timing windows. The banks of the memory are mapped to bits in the activity and closure registers. Page activity occurring a timing window is tracked by setting appropriate bit(s) in the activity register and resetting appropriate bit(s) in the closure register. At the end of each timing window, page(s) that were both opened in the previous timing window and are not represented in the activity register are scheduled for closure by setting corresponding bit(s) in the closure register. Then the activity register is reset and the process is repeated.

29 Claims, 4 Drawing Sheets

INDIVIDUAL MEMORY PAGE ACTIVITY TIMING METHOD AND SYSTEM

FIELD OF THE INVENTION

The present invention relates to electronic circuitry and, more particularly, to timer circuits for use with memories.

BACKGROUND

Memory controller circuits can be used in a variety of computer systems (e.g., desktop personal computers, notebook computers, personal digital assistants, etc.) to facilitate the computer system's processor in accessing memory chips. These memory chips generally include the main memory of the computer system, which typically includes several dynamic random access memory (DRAM) chips. DRAM chips include, for example, synchronous DRAM (SDRAM), extended data out (EDO) DRAM, Rambus (R)DRAM, DDR (double data rate) and DRAM chips. The memory controller provides a memory interface for connecting to one or more of such DRAM chips, and a system interface to connect to the system processor(s). The memory controller uses these interfaces to route data between the processor and the DRAM chips using appropriate address, control and data signals.

Generally, the DRAM chips used in modern computers are organized in groups and mounted on one or more "memory modules." Common memory modules in use today are known as DIMMs (Dual In-line Memory Modules) that typically include one or more DRAM chips mounted on a small circuit board.

Typically, a modern DIMM can store 32, 64, 128, 256, and 512 megabytes (Mb) of memory, which corresponds to the total memory capacity of the memory chips on the DIMM. The memory on each DRAM chip is logically arranged into a memory array of several rows and columns of memory "cells." Each memory cell has a particular address, and stores a single bit of data. This memory array is then logically partitioned into one or more "banks" of memory. In modern DRAM chips, memory is accessed on a "page" basis, wherein the memory cells for a given row within a bank form a "page" of memory.

Accessing DRAM is generally a multi-step process that is performed by the memory controller in the following manner. First, the page(s) corresponding to the requested data or instructions are identified. Once the page(s) are known, the appropriate bank corresponding to the page(s) is/are determined. Generally, the particular page(s) of data requested will initially be in one of three states: page hit, page empty, or page miss. If the state is a page hit, a desired page is already loaded into a bank of sense amplifiers (amps) corresponding to the memory bank the page is stored in. If the state is a page empty, data corresponding to the desired page will need to be loaded into an appropriate sense amp bank via an "activate" command before it can be accessed. If the state is a page miss, the specified bank contains a different page of data than that requested. This existing page will first be required to be "closed," which includes writing it back to the DRAM memory array using a "precharge" command, and then loading the appropriate page into the sense amp bank using the activate command.

The foregoing three states have an impact on access latency. A page hit state means the page is ready to be accessed with no additional latency. A page empty state requires an activate command, while a page miss requires both pre-charge and activate commands, each of which may take one or more clock cycles. The actual penalty (i.e., delay) for each type of access will depend on the memory technology, memory organization and architecture, and on other rules specific to each memory technology. The general rule however is that a page hit is fastest, and a page empty is slower, and a page miss is slowest. Also, keeping a page open dissipates power. Thus, from a power standpoint it may be desirable to close pages sooner rather than later.

Some existing page-management policies include timer mechanisms. With timer mechanisms, "idle" timers are used to determine that memory in general, or a specific bank in particular, have been idle for some predetermined number X clock cycles. If X clock cycles have transpired with no accesses, the page(s) is/are closed. The counters may be per bank, in which case only that bank's pages will be closed when the timer expires, but such mechanisms would require a large number of timers in DIMMs with a large number of banks. Each timer occupies area and dissipates power and, thus, a large number of timers may be undesirable in some applications. Other implementations may have a timer per DIMM or a timer for all of the system memory. In such implementations, all pages in a DIMM or all of the system memory may be closed when the timer expires. However, such timer mechanisms provide relatively coarse page management.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
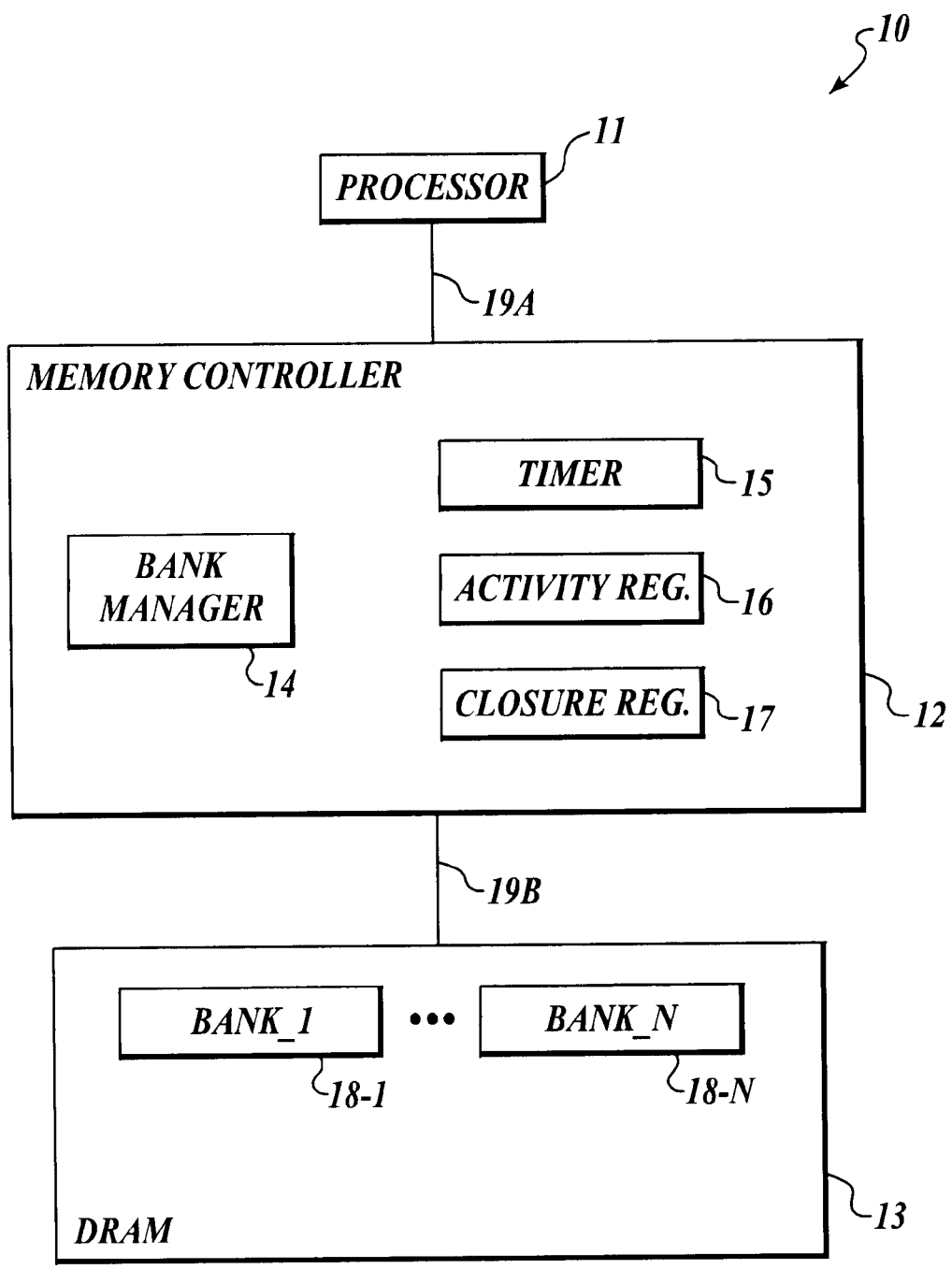
FIG. 1 is a block diagram illustrating a system with a timer for individual page activity timing, according to one embodiment of the present invention.

FIG. 1 illustrates a processor system 10 having a timer for individual page activity timing, according to one embodiment of the present invention. In particular, this embodiment of system 10 includes a processor 11, a memory controller 12 and a memory 13. Memory 13 is a DRAM memory in the illustrated embodiment, but can be any type of memory that has banks and pages (or their equivalent). Many such memory devices are commercially available. Memory 13, in this embodiment, is partitioned into banks 18-1 through 18-N, where N represents an integer typically greater than or equal to two. In one exemplary embodiment, memory 13 is portioned into thirty-two banks.

In addition, this embodiment of memory controller 12 includes a bank manager 14, a timer 15, an activity register 15 and a closure register 17. Bank manager 14 is typically implemented as a finite state machine or sequencer using combinatorial logic or other logic circuit. Bank manager 14 provides control signals to timer 15, activity register 16 and closure register 17, along with signals used in accesses of memory 13. Although in this embodiment memory controller 12 is shown separate from processor 11, in other embodiments, memory controller 12 can be combined with processor 11 on a single chip.

In this embodiment, timer 15 is a programmable timer, although timer 15 may be fixed in other embodiments. For example, timer 15 may be programmed to define a time window that can be adjusted as described in commonly-assigned U.S. patent application Ser. No. 10/039,087 entitled "Method for Dynamically Adjusting a Memory Paging Closing Policy" filed Jan. 3, 2002 by Opher D. Kahn and Jeffrey R. Wilcox.

Activity register 16 is a register having at least N bits. Further, each bank 18-1 through 18-N is mapped to a unique bit of activity register 16. For example, bank 18-1 may be mapped to a bit b1 (not shown) of activity register 16; bank 18-2 may be mapped to a bit b2 (not shown) of activity register 16, and so on. Similarly, closure register 17 is a register having at least N bits, with each bank 18-1 through 18-N being mapped to a unique bit of closure register 17.

Processor 11 is connected to memory controller 12. Bank manager 14 of memory controller 12 provides control signals to timer 15, activity register 16 and closure register 17. Memory controller 12 is connected to memory 13. Banks 18-1 through 18-N can receive or provide pages of data stored in the banks to memory controller 12 in response to control signals provided by memory controller 12.

Memory controller 12 can include a "bank valid" register (not shown) as part of the circuitry used to determine whether a request is a page hit, a page miss or a page empty. The "bank valid" register tracks pages that are opened.

An example memory access operation is described below to help understand the basic operation of an individual page activity timing process according to the present invention. For this example, the operation begins with timer 15 being reset and then started to initiate a time window.

Processor 11 then requests a memory access. For example, the memory access request may address bank 18-1 of memory 13 during this time window. The bit corresponding to bank 18-1 (for example, a bit b1) is then set in activity register 16. At the end of this time window, the banks corresponding to all open pages are scheduled for closure (e.g., determined from the bits, if any, that were set in the "bank valid" register), except those corresponding to the set bits in activity register 16. That is, the new activity recorded in activity register 16 allows the corresponding bank(s) to remain open for another timing window.

The bit(s) corresponding to bank(s) scheduled for closure are then set in closure register 17. For example, if a page in bank 18-2 were opened in the previous time window, bank 18-2 would be scheduled for closure at the end of this time window by having its corresponding bit set in closure register 17. In one embodiment, a logic block for closing banks checks the closure register to identify which block(s) to close. When a bank is closed, its corresponding bit in closure register 17 is reset. At the end of this time window, activity register 16 is reset so that it can record page activity occurring in the next time window.

Stated another way, banks having page activity during a time window are "recorded" in the activity register and "removed" from the closure register (if present in the closure register). At the end of a time window, all of the banks that were open in the previous time window and are not recorded in the activity register during the present time window are scheduled to be closed. The banks scheduled to be closed are "recorded" in the closure register. When a bank is closed, it is "removed" from the closure register. The activity register is cleared at the end of a time window and the process is repeated for next time window. One embodiment of this process is described in more detail below in conjunction with FIG. 2.

A system according to the present invention can advantageously provide "per bank" timing using only a single timer and two registers, thereby realizing a significant savings in chip area and power consumption compared to conventional systems that use a timer for each bank. In addition, a system according to the present invention, advantageously allows for finer control of page management compared to conventional systems that use one timer for all of the banks.

Figure 2:
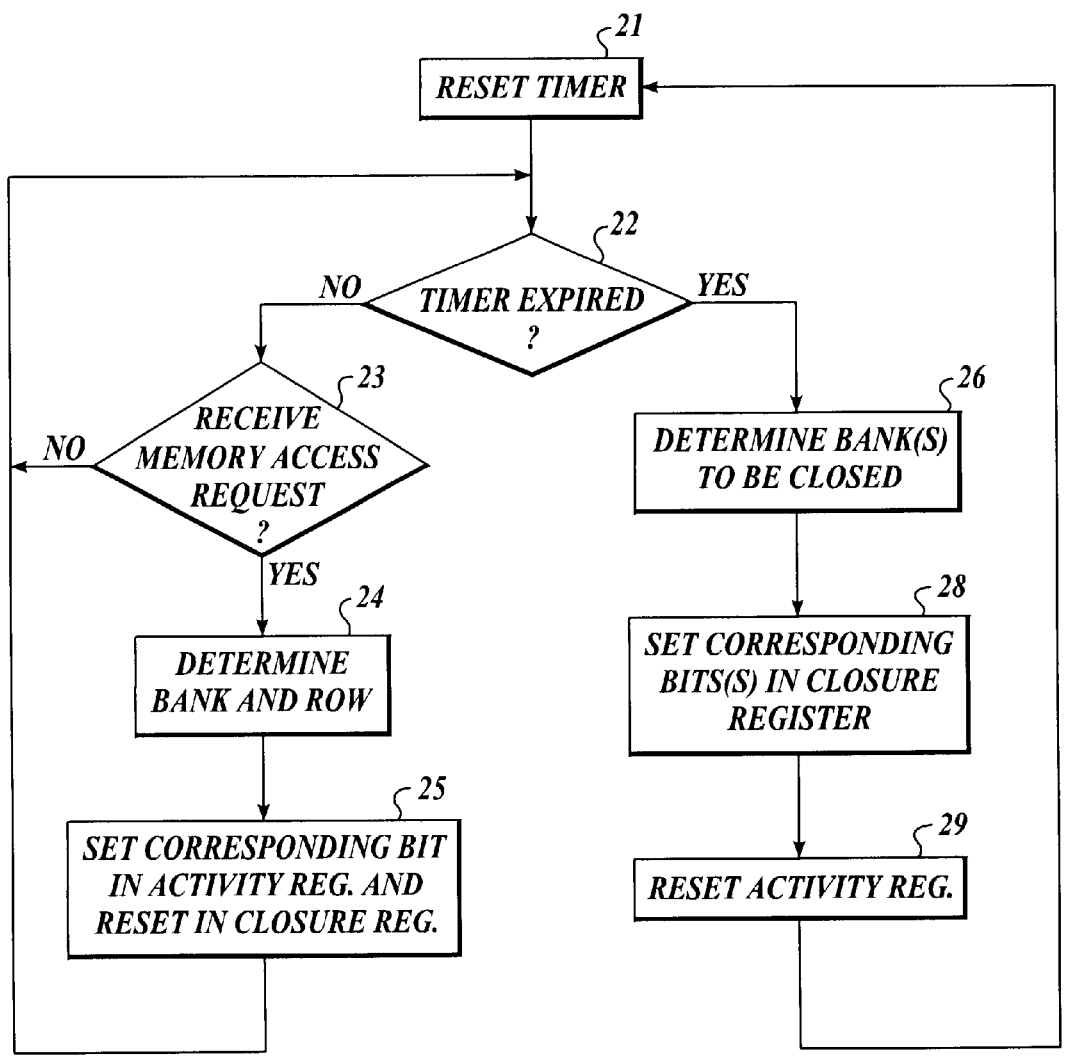
FIG. 2 is a flow chart illustrating the operation of the system depicted in FIG. 1, according to one embodiment of the present invention.

FIG. 2 illustrates the operational flow of processor system 10 (FIG. 1) in individually timing page activity of memory 13 (FIG. 1), according to one embodiment of the present invention. Referring to FIGS. 1 and 2, system operates as follows.

At the beginning of an activity time window, timer 15 is reset as represented in a block 21. In one embodiment, bank manager 14 provides a control signal to timer 15 that when asserted causes timer 15 to be reset. Upon being reset, timer 15 then counts each cycle of a clock signal until a preselected number of cycles have been reached. In this embodiment, when the timer's count reaches the preselected number, the timer or time window is considered expired. In one embodiment, the clock signal is the clock signal that is part of the interface of memory 13.

The count of timer 15 is then checked to determine whether the timer or time window is expired, as represented in a block 22. In one embodiment, bank manager 14 compares the count of timer 15 with the predetermined number. In other embodiments, different circuitry may be used to determine whether the preselected number of clock cycles has been reached.

If the timer has not expired, commands are monitored to detect whether memory controller 12 has received any memory access requests, as represented in a block 23. In one embodiment, memory controller 12 will receive a memory access request from processor 11. This request can be either a memory read or a write. If no such request is detected, the operational flow returns to block 22.

If a request is received, the bank (i.e., one of banks 18-1 through 18-N) and row addressed by the memory request is determined, as represented in a block 24. In one embodiment, bank manager 14 determines the bank and row corresponding to the received memory access request.

The bit corresponding to the bank (determined in block 24) is set in activity register 16, as represented in a block 25. In one embodiment, bank manager 14 sets the bit in activity register 16. If the bit is already set, bank manager 14 maintains the bit in the set state. In addition, if the corresponding bit in closure register 17 is set, this bit is reset. That is, if the bank's page was scheduled for closure, this new activity in that bank allows the page to remain opened for another time window. The operational flow then returns to block 22.

On the other hand, if in block 22 the count of timer 15 indicates the timer has expired, the operational flow of system 10 proceeds to a block 26. In block 26, the bank(s) to be closed are determined. For example, in one embodiment, bank manager 14 determines which banks were open during the expired time window by checking the aforementioned "bank valid" register (not shown). Bank manager 14 compares the contents of "bank valid" register with that of activity register 17. The banks to be closed are those banks (if any) having their associated bits set in the bank valid register but not set in the activity register. In one embodiment, when a boundary case occurs (i.e., when the timer expires during the same clock cycle that a memory access occurs to a bank that is scheduled for closure), the bank is not closed.

The bank(s) (if any) determined in block 26 are then scheduled for closure, as represented by a block 28. In one embodiment, the bit corresponding to each bank to be closed (if any) is set in closure register 17. As previously described, in one embodiment, the logic block for closing banks checks closure register 17 to determine which banks to close. In one embodiment, this logic block causes bank manger 14 to issue a precharge command to memory 13. For each bank that this logic block closes, it also resets the corresponding bit in closure register 17.

Activity register 16 is then reset, as represented by a block 29. In one embodiment, bank manager 14 provides a control signal to activity register 17, which causes the activity register to reset the bits corresponding to banks 18-1 through 18-N. In this way, activity register 16 is configured to track page activity in the next time window. The operational flow then returns to block 21 so that the entire process can be repeated. Although FIG. 2 illustrates the blocks as being performed sequentially in certain order, in other embodiments blocks may be performed in different orders, combined, or performed concurrently.

Figure 3:
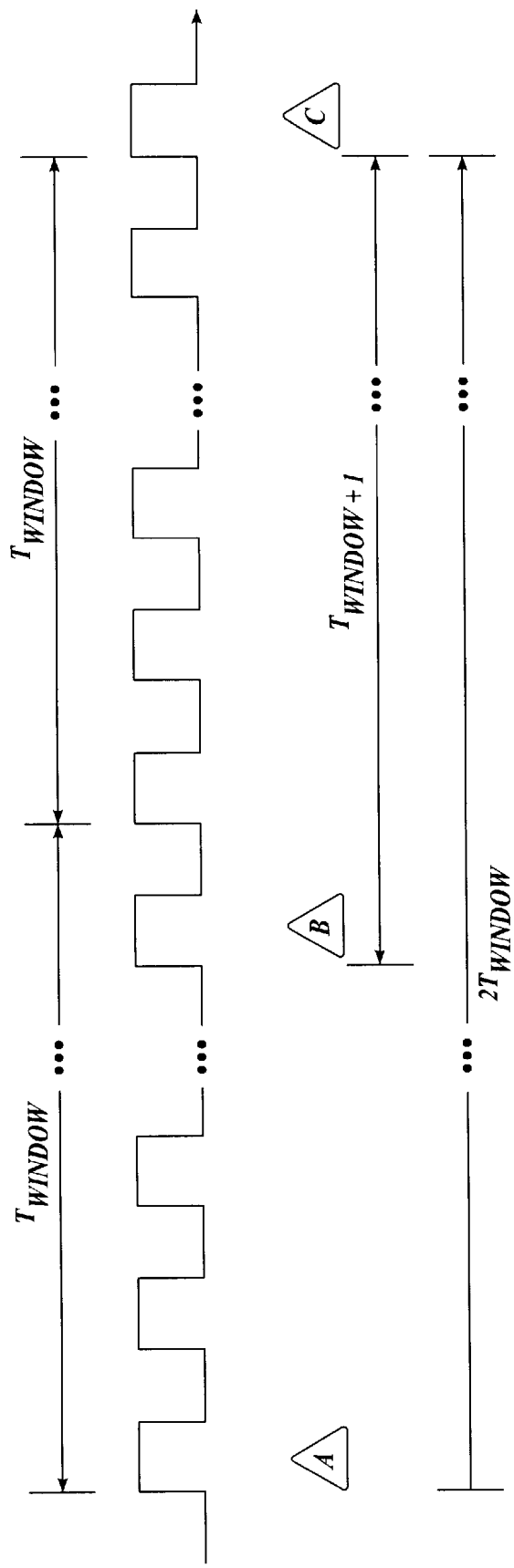
FIG. 3 is a diagram illustrating the time range that can elapse before closing a page using the system depicted in FIG. 1, according to one embodiment of the present invention.

FIG. 3 illustrates the possible range of time between a page activity and subsequent page closure due to lack of activity of system 10 (FIG. 1), according to one embodiment of the present invention. Each time window has a duration of M clock cycles. Referring to FIG. 3, a marker A indicates when page activity for a "first" bank occurred during a first time window. In this example, the page activity occurred during the first clock cycle of the first time window. A marker B indicates when page activity for a "second" bank occurred during the first time window. In this example, this page activity occurring the Mth clock cycle of the first time window. Further, in this example, no activity for these "first" and "second" banks occurred during the second time window. Consequently, at the end of the second time window, these banks were scheduled for closure as described above in conjunction with FIGS. 1 and 2.

A marker C indicates when the pages for the first and second banks were scheduled for closure by system 10. More particularly, the pages were scheduled for closure after the Mth clock cycle of the second time window. As a result, the page of the first bank remained open for the equivalent of two time windows (i.e., 2M clock cycles). However, the page of the second bank remained open for the equivalent of a time window plus one clock cycle (i.e., M+1 clock cycles). Thus, there is an uncertainty of about M−1 clock cycles in the amount of time a bank may be inactive before being closed. This uncertainty is acceptable for many applications in view of the savings in chip area and power consumption.

Figure 4:
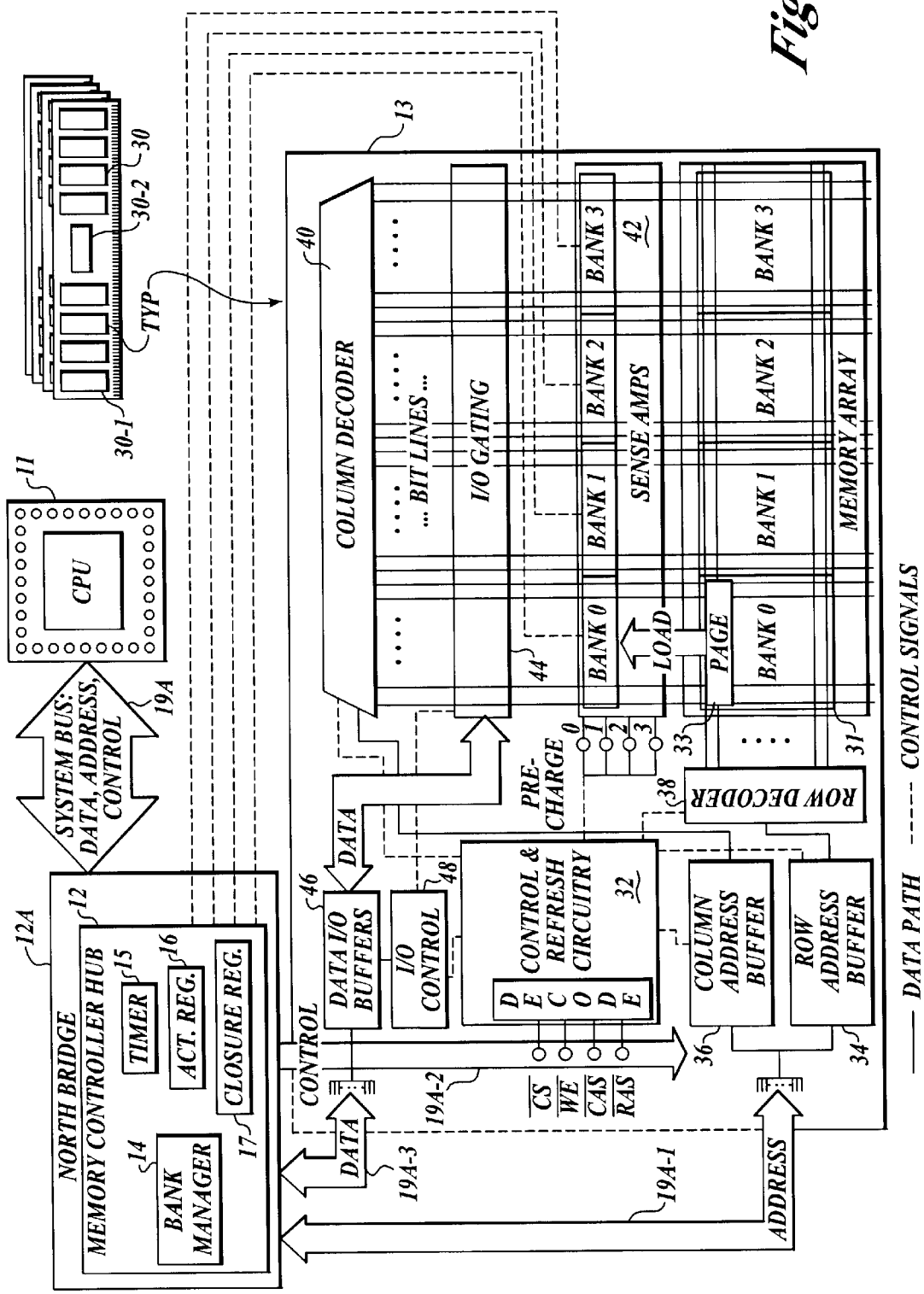
FIG. 4 is a schematic diagram of an exemplary computer system that is suitable for implementing the present invention.

FIG. 4 illustrates an exemplary implementation of processor system 10 (FIG. 1), according to one embodiment of the present invention. This implementation of system 10 includes: (a) processor 11; (b) a memory controller chipset 12A that includes memory controller 12 (which in this implementation is a memory controller hub or MCH); and (c) memory 13 that is implemented using a DIMM 30.

In one exemplary implementation, memory controller chipset 12A is a "North Bridge" chip set available from Intel Corporation, Santa Clara, Calif. In addition, in this exemplary implementation, DIMM 30 includes several DRAM chips 30-1 and a control chip(s) 30-2. Further, in this exemplary implementation, each DRAM chip 30-1 includes a memory array 31, control and refresh circuitry 32, a row address buffer 34, a column address buffer 36, a row decoder 38, a column decoder 40, several sense amplifiers 42, input/output (I/O) gating 44, data I/O buffers 46, and I/O control 48. This DRAM architecture is typical of many commercially available DRAM chips.

Memory controller chipset 12A is connected to processor 11 via a system bus 19A (which includes an address bus, a control bus and a data bus). In addition, memory controller chipset 12A is connected to each DRAM chip 30-1 of memory 13 via an address bus 19B-1, a control bus 19B-2, and a data bus 19B-3 (also collectively referred to as a memory bus).

A typical memory access sequence in the implementation of FIG. 4 is described below to help understand the basic operation of an individual page activity timing process according to the present invention. The sequence begins when a request for one or more bytes of data or instructions is made by an application (or an operating system module acting as a proxy for the application) executing on processor 11. Typically, the memory request will reference a memory address range corresponding to where the desired data or instructions are stored in memory 13. For example, a request to load a subroutine will identify the starting and ending addresses corresponding to the memory cells the subroutine instructions are stored in. In the illustrated implementation, this request is passed to memory controller chipset 12A via system bus 19A. System bus 19A provides a plurality of system data bus lines, system address bus lines, and system control lines that enable data and requests to be transferred between the processor and other system components connected to the system bus, including various components provided by memory controller chipset 12A.

As previously mentioned, memory controller 12A can be implemented with a North Bridge chipset in some embodiments. North Bridge chipsets are commonly used in computer systems that employ PCI (Peripheral Component Interface) devices and peripherals, such as computers that employ Intel processors. Generally, the North Bridge chipset will provide a plurality of functions that may be implemented on multiple chips or a single chip. These functions typically include memory interface functions provided by memory controller such as MCH 12. Optionally, MCH 12 (or a similar memory controller) may be directly connected to processor 11 via the system bus (configuration not shown).

Upon receiving the memory access request, MCH 12 determines the particular memory bank in which the memory is stored, and generates appropriate address signals and control signals (on buses 19B-1 and 19B-2) to perform a memory access of the bank. As discussed above, each DRAM chip comprises an array of cells logically partitioned into one or more banks. This is depicted as memory array 31 and bank 0 through bank 3 in FIG. 4. Individual memory cells are identified by the addresses of the row and column they reside in. Generally, data and instructions are stored in bytes or words of data, wherein each byte comprises eight adjacent cells and each word comprises the data stored in L adjacent memory cells in the same row, with L representing the length of the word. Typically, to access a particular word, the address for the first bit of the word is provided, with optional information specifying the length of the word. Accordingly, to access a particular set of bytes or words (e.g., related data or instructions) the address range for those data or instructions will be provided to MCH 12. However, rather than only access just the data/instructions within the provided address range, in most modern DRAMS, data corresponding to one or more pages (as necessary) that encompass the address range are retrieved by opening those pages. For purposes of illustration, it will be assumed that a single memory page 50 stored in bank 0 is accessed in the current example.

In this example, opening a memory page includes having MCH 12 send an ACTIVATE command to DRAM chip 30-1, wherein an appropriate set of control signals are sent to DIMM 30 along with address signals via buses 19B-1 and 19B-2. In the illustrated embodiment, the control signals include a CS# (chip select) signal, a WE# (write enable) signal, a CAS# (column access strobe) signal, and a RAS# (row access strobe) signal, which are received by control and refresh circuitry 32. In some DIMM architectures, control signals and other various signals are received by one or more control chips on DIMM 30 (depicted as control chip 30-2) that are used to provide top-level control operations for DRAM chips 30-1. Thus, in these configurations, the control signals are deciphered by the control chip(s) and appropriate control signals are passed on and/or generated to an appropriate DRAM chip corresponding to the page address specified by the address signals.

The ACTIVATE command opens or activates a row specified by the current row address signals, which are latched into a row address buffer 34 in the illustrated embodiment in response to the DRAM chip receiving control signals an ACTIVATE command. Depending on the particular architecture of the memory controller and the memory bus, the row and column address signals may be sent over a single multiplexed set of address signal lines or via separate groups of addresses signal lines. In response to a READ or WRITE command (as specified by the logic levels of appropriate sets of CS#, WE#, CAS#, and RAS# signals) Column address data are latched into a column address buffer 36 in a similar manner to how row address data are latched. The column and row addresses stored in the row and column address buffers are then decoded by internal circuitry in the DRAM chip to identify a corresponding bank and page containing the requested memory access address range, as depicted by a row decoder 38 and a multiplexed column decoder 40.

As discussed above, in modern DRAMs, data is typically accessed on a page-wise basis, rather than a byte- or word-wise basis. At first glance, one might think it would be possible to directly access a row of data within a selected memory bank. However, data may not be accessed directly from the memory cells because of how DRAM memory cells work. DRAM chips are termed "dynamic" RAM because their memory cells have to be dynamically refreshed on a frequent basis (e.g., >1000 or even >10,000 times/sec). This is because each memory cell comprises a "leaky" capacitor that can only hold a charge for a very short duration. In order to maintain data, cells corresponding to logical 1's must be refreshed (i.e., recharged) using a refresh cycle that is automatically performed by control and refresh circuitry 32 on a continuous basis. As a result, if a cell were to be directly "read," it could lose its charge, and thus its data.

In order to avoid these problems, DRAMS use sense amplifiers 42, with one sense amplifier (also referred to as sense amps) per column line. Accordingly, the sense amps are partitioned into sense amp banks, wherein the width of each bank corresponds to the page length of its respective corresponding memory array bank. The sense amps perform two functions. One function is to "sense" the charge held in the memory cell corresponding to their respective column and currently asserted row, and then amplify the sensed signal. For example, if the charge in a given cell is sensed to be above a predetermined threshold, the sense amp generates a voltage signal output corresponding to a logical "1," while if the charge sensed is below the threshold the sense amp generates a voltage signal output corresponding to a logical "0." The second function provided by the sense amps is a buffering function, whereby the amplified signals may be accessed without adversely affecting the charges of the data stored in memory.

In the illustrated embodiment, the sense amps are accessed via I/O gating 44, which passes data to and receives data from data I/O buffers 46 in response to control signals generated by I/O control 48 and control and refresh circuitry 32. The architecture depicted in FIG. 1 is merely exemplary, as various other architectures may also be used to transfer data between the sense amps and the data I/O buffers (or directly to the memory bus in unbuffered DIMMs). MCH 12 can then retrieve data stored in data I/O buffers 46 over data bus 19B-3 using an appropriate set of control signals (via control bus 19B-2) corresponding to READ and WRITE commands.

Once data has been accessed from a given page, the corresponding data is maintained in the sense amplifier bank corresponding to the page. In order to access another page of data in the same bank, a PRECHARGE command is issued. This restores the charges in the row and bank of memory cells corresponding to the initial page (also known as a write-back) and prepares the sense amp bank for a new page of data. In one type of SDRAM architecture, for example, the PRECHARGE command will be issued via a combined set of CS#, WE#, CAS# and RAS# signals. In one embodiment common to many memory controller command sets, the PRECHARGE command signal set comprises respective signals of (L, L, H, L) for CS#, WE#, CAS# and RAS#. The particular combination of signals used will be architecturally specific to the control signals provided by MCH 12 (or similar memory controller); such signal combinations are well known in the art, and accordingly, these various combinations are not discussed further herein. Once the PRECHARGE command is issued, the bank will not be available for a subsequent access until a predefined (architecture dependent) time has passed. Furthermore, once a bank has been precharged, it is in an idle (empty) state and must be activated with the ACTIVATE command prior to an READ or WRITE command being issued to the bank.

In accordance with principles of the present invention, a timer mechanism is implemented to provide per-bank timing using a single timer. In one embodiment, the timer mechanism is programmable. In this embodiment, each memory bank's accesses are tracked by MCH 12, and the memory controller uses timer 15, activity and closure registers 16 and 17 to determine when to close pages as described above in conjunction with FIGS. 1 and 2.

If the timer trip point is set to a predetermined minimum allowed value (or some other special indication), the page will be closed as soon as its last access (i.e., READ or WRITE) has been completed. This is equivalent to a conventional "close-page" policy. On the other extreme, if the timer trip-point is set to a maximum, MCH 12 will not close the page unless it has to (due to other DRAM architecture rules), or it will close the page after a very long time. This is equivalent to a conventional "open-page" policy. For policies in between these two extremes, a timer trip point will determine when pages are closed. A small trip value will cause the mechanism to behave more like the "close-page" policy, while larger trip values will behave more like the "open-page" policy. The mechanism further implements a recall operation that stores an identity of the last page that was open for each bank. In other words, the controller remembers which page was open in a particular bank even after it has been closed, unless it has opened a new page instead.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-ll file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flach memory device etc. In addition, a machine-readable medium can include propagated signals such as electrical, optical, acoustical or other form of propagated signals (e.g., carrier waves, infrared signals, digital signals, etc.).

Although the present invention has been described in connection with a preferred form of practicing it and modifications thereto, those of ordinary skill in the art will understand that many other modifications can be made to the invention within the scope of the claims that follow. Accordingly, it is not intended that the scope of the invention in any way be limited by the above description, but instead be determined entirely by reference to the claims that follow.

what is claimed is:

1. A method for use with a memory having a plurality of banks, the method comprising:
   detecting memory accesses to the memory;
   tracking, for each bank of the plurality of banks, an amount of time that has elapsed for each detected memory access using a number of timers less than the number of banks in the plurality of banks.

2. The method of claim 1, wherein tracking the amount of time comprises using a single timer.

3. The method of claim 2, wherein tracking the amount of time further comprises:
   tracking banks of the plurality of banks that were accessed during a first timing window defined by the single timer.

4. The method of claim 3, further comprising:
   scheduling a closure of a page of a tracked bank, wherein the page is closed during a timing window subsequent to the first timing window.

5. The method of claim 3, wherein tracking the amount of time further comprises:
   tracking in a first register each detected memory access that occurred during the first timing window.

6. The method of claim 5, wherein tracking the amount of time further comprises:
   during a second timing window subsequent to the first timing window, tracking in a second register each bank of the plurality of banks for which a memory access was detected that occurred during the first timing window.

7. The method of claim 6, wherein tracking the amount of time further comprises:
   during the second timing window, ending the tracking in the second register of any bank of the plurality of banks for which a memory access of that bank is detected during the second timing window.

8. The method of claim 2, wherein the timer is programmable.

9. An apparatus for use with a memory having a plurality of banks, the apparatus comprising:
   means, couplable to the memory, for detecting memory accesses to each bank of the plurality of banks;
   means for tracking an amount time that has elapsed for each bank of the plurality of banks having a detected memory access using a number of timers that is less than the number of banks in the plurality of banks.

10. The apparatus of claim 9, wherein the means for tracking uses a single timer to track an amount of time that has elapsed for each bank of the plurality of banks having a detected memory access.

11. The apparatus of claim 10, wherein the means for tracking includes means for tracking banks of the plurality of banks having memory accesses during a first timing window.

12. The apparatus of claim 11, further comprising:
   means for scheduling a closure of a bank of the plurality of banks that is accessed during the first timing window but not accessed during a second timing window that is started when the first timing window ends.

13. The apparatus of claim 12, wherein the means for tracking further comprises:
   a first register to track each bank of the plurality of banks having a memory access that occurred during the second timing window.

14. The apparatus of claim 13, wherein the means for tracking further comprises:
   a second register to track each bank of the plurality of banks that is scheduled to be closed.

15. The apparatus of claim 14, wherein the means for tracking, during the second timing window, to stop tracking in the second register any bank of the plurality of banks being tracked in the first register.

16. The apparatus of claim 10, wherein the timer is programmable.

17. A circuit for use with a memory having a plurality of banks, the circuit comprising:
  a timer to define a plurality of sequential timing windows;
  a first register having a plurality of bits associated with the plurality of banks, wherein each bank of the plurality of banks has an associated bit in the first register;
  a second register having a plurality of bits, each bank of the plurality of banks having an associated bit in the second register; and
  a logic circuit coupled to the timer and first and second registers, the logic circuit to track in the first register each bank of the plurality of banks for which a memory access occurred during a first timing window.

18. The circuit of claim 17 wherein the logic circuit is configurable to track in the second register each bank of the plurality of banks for which a memory access occurred prior to the first timing window.

19. The circuit of claim 18 wherein the logic circuit is further configurable to stop tracking in the second register any bank being tracked in the first register.

20. The circuit of claim 18 wherein the logic circuit further to stop tracking in the second register any bank of the plurality of banks that was closed during the first timing window.

21. A method for use with a memory having a plurality of banks, the method comprising:
  resetting a timer to start a first timing window;
  determining whether the timer has expired;
  if the timer is not expired, detecting a memory access;
  determining a bank addressed by the detected memory request; and
  setting a bit in a first register that corresponds to the bank determined to be addressed by the detected memory request.

22. The method of claim 21 further comprising: if the timer has expired:
  determining whether a bank of the plurality of banks had an open page when the first timing window was started;
  scheduling for closure a bank that had an open page when the first timing window started by setting a bit in a second register, each bank of the plurality of banks having a corresponding bit in the second register; and
  resetting the first register.

23. The method of claim 22 wherein setting a bit in a first register further comprises resetting in the second register a bit that corresponds to the bank determined to be addressed by the detected memory request.

24. The method of claim 22 wherein a bank is not scheduled for closure if a memory access to the bank occurs during a clock cycle at which the timer expires.

25. The method of claim 22 wherein the timer is programmable.

26. A system comprising:
  a processor;
  a memory having a plurality of banks;
  a memory controller coupled to the processor and the memory, wherein the memory controller includes:
    a timer to define a plurality of sequential timing windows;
    a first register having a plurality of bits, wherein each bank of the plurality of banks has a corresponding bit in the first register; and
    a logic circuit coupled to the timer and first register, the logic circuit to track in the first register each bank of the plurality of banks for which a memory access occurred during a first timing window.

27. The system of claim 26 wherein the memory controller further includes:
  a second register having a plurality of bits, each bank of the plurality of banks having a corresponding bit in the second register, wherein the logic circuit to track in the second register each bank of the plurality of banks that is scheduled for closure.

28. The system of claim 27 wherein the logic circuit is configurable to schedule for closure any bank of the plurality of banks that was accessed in a timing window that occurred previous to the first timing window.

29. The system of claim 27 wherein, during the first timing window, the logic circuit is further configurable to stop tracking in the second register any bank of the plurality of banks for which a bit was set in the first register.

* * * * *